(12) United States Patent
Besser et al.

(10) Patent No.: US 6,656,834 B1
(45) Date of Patent: Dec. 2, 2003

(54) METHOD OF SELECTIVELY ALLOYING INTERCONNECT REGIONS BY DEPOSITION PROCESS

(75) Inventors: Paul R. Besser, Sunnyvale, CA (US); Larry Zhao, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 76 days.

(21) Appl. No.: 09/884,027

(22) Filed: Jun. 20, 2001

(51) Int. Cl.$^7$ .......................................... H01L 21/4763
(52) U.S. Cl. ........................ 438/629; 438/622; 438/625; 438/626; 438/627; 438/628; 438/631; 438/633; 438/675; 438/687
(58) Field of Search ................................. 438/622, 625, 438/626, 627, 628, 629, 631, 633, 675, 687

(56) References Cited

U.S. PATENT DOCUMENTS

| | | | |
|---|---|---|---|
| 5,824,597 A | * 10/1998 | Hong | 438/625 |
| 5,913,147 A | * 6/1999 | Dubin et al. | 438/687 |
| 5,930,669 A | * 7/1999 | Uzoh | 438/627 |
| 5,981,382 A | * 11/1999 | Konecni et al. | 438/646 |
| 6,130,161 A | 10/2000 | Ashley et al. | 438/687 |
| 6,144,096 A | 11/2000 | Lopatin | 257/751 |
| 6,160,315 A | 12/2000 | Chiang et al. | 257/762 |
| 6,242,349 B1 | 6/2001 | Nogami et al. | 438/687 |
| 6,249,055 B1 | 6/2001 | Dubin | 257/758 |
| 6,268,289 B1 | * 7/2001 | Chowdhury et al. | 438/687 |

FOREIGN PATENT DOCUMENTS

JP 10294317 4/1998

* cited by examiner

Primary Examiner—Amir Zarabian
Assistant Examiner—Jeff Vockrodt

(57) ABSTRACT

A metal interconnect structure and method for making the same provides an alloying elements layer that lines a via in a dielectric layer. The alloying element layer is therefore inserted at a critical electromigration failure site, i.e., at the fast diffusion site below the via in the underlying metal. Once the copper fill is performed in the via, an annealing step allows the alloying element to go into solid solution with the copper in and around the via. The solid solution of the alloying element and copper at the bottom of the via in the copper line improves the electromigration reliability of the structure.

11 Claims, 4 Drawing Sheets

METHOD OF SELECTIVELY ALLOYING INTERCONNECT REGIONS BY DEPOSITION PROCESS

FIELD OF THE INVENTION

The present invention relates to the field of semiconductor processing and, more particularly, to reduction of electromigration voids in metal interconnect structures.

BACKGROUND OF THE INVENTION

The escalating requirements for high density and performance associated with ultra large scale integration (ULSI) semiconductor device wiring are difficult to satisfy in terms of providing submicron-sized, low resistance-capacitance (RC) metallization patterns. This is particularly applicable when the submicron features, such as vias, contact areas, lines, trenches, and other shaped openings or recesses have high aspect ratios (depth-to-width) due to miniaturization. Conventional semiconductor devices typically comprise a semiconductor substrate, usually a doped monocrystalline silicon (Si), and plurality of sequentially formed interlayer dielectrics and electrically conductive patterns. An integrated circuit is formed therefrom containing a plurality of patterns of conductive lines separated by inter-wiring spacings. Typically, the conductive patterns of vertically spaced metallization layers are electrically connected by vertically oriented conductive plugs filling via holes formed in the interlayer dielectric layer separating the metallization layers, while other conductive plugs filling contact holes establish electrical contact with active device regions, such as a source/drain region of a transistor, formed in or on a semiconductor substrate. Conductive lines formed in trench-like openings typically extend substantially parallel to the semiconductor substrate. Semiconductor devices of such type according to current technology may comprise five or more levels of metallization to satisfy device geometry and micro-miniaturization requirements.

A commonly employed method for forming conductive plugs for electrically interconnecting vertically spaced metallization layers is known as "damascene" -type processing. Generally, this processing involves forming an opening (or via) in the dielectric interlayer, which will subsequently separate the vertically. spaced metallization layers. The via is typically formed using conventional lithographic and etching techniques. After the via is formed, the via is filled with conductive material, such as tungsten or copper, using conventional techniques. Excess conductive material on the surface of the dielectric interlayer is then typically removed by chemical mechanical planarization (CMP).

High performance microprocessor applications require rapid speed of semiconductor circuitry, and the integrated circuit speed varies inversely with resistance and capacitance of the interconnection pattern. As integrated circuits become more complex and feature sizes and spacings become smaller, the integrated circuit speed becomes less dependent upon the transistor itself and more dependent upon the interconnection pattern. If the interconnection node is routed over a considerable distance, e.g., hundreds of microns or more, as in submicron technologies, the interconnection capacitance limits the circuit node capacitance loading and, hence, the circuit speed. As integration density increases and feature size decreases, in accordance with submicron design rules, the rejection rate due to integrated circuit speed delays significantly reduces manufacturing throughput and increases manufacturing costs.

One way to increase the circuit speed is to reduce the resistance of a conductive pattern. Aluminum is conventionally employed because it is relatively inexpensive, exhibits low resistivity, and is relatively easy to etch. However, as the size for openings for vias/contacts and trenches is scaled down to the submicron ranges, step coverage problems result from the use of aluminum. Poor step coverage causes high current density and enhanced electromigration. Moreover, low dielectric constant polyamide material, when employed as dielectric interlayers, create moisture/bias reliability problems when in contact with aluminum, and these problems have decreased the reliability of interconnections formed between various metallization layers.

Copper (Cu) and Cu-based alloys are particularly attractive for use in VLSI and ULSI semiconductor devices, which require multi-level metallization layers. Copper and copper-based alloy metallization systems have very low resistivities, which are significantly lower that tungsten and even lower than those of previously preferred systems utilizing aluminum and its alloys. Additionally, copper has a higher resistance to electromigration. Furthermore, copper and its alloys enjoy a considerable cost advantage over a number of other conductive materials, notably silver and gold. Also, in contrast to aluminum and refractory-type metals, copper and its alloys can be readily deposited at low temperatures formed by well-known (wet) plating techniques, such as electroless and electroplating techniques, at deposition rates fully compatible with requirements of manufacturing throughput.

FIG. 1 depicts a schematic cross-section of a portion of a metal interconnect structure employing copper damascene technology. The lower level metal layer 10 (including a copper line), also referred to as M1, is connected to a higher level metal layer 16 (including a copper line) through a via 14. Barrier layers 18 and 20, formed of nitride, for example, cover the metal layers 10, 16. The metal layer 10, 16 are separated by a dielectric layer 12, such as formed by an oxide, for example. The via 14 is filled with metal to form a conductive plug 15.

The formation of the via 14 involves performing a via etch through the dielectric layer 12 and the barrier layer 20, stopping on the underlying metal layer 10. A pre-sputter etch process, using argon, for example, is normally employed prior to the via barrier and copper deposition.

Electromigration (EM) has been defined as the transport of metal atoms by momentum exchange between electrons, moving under the influence of a field, and metal ions. Two of the critical interfaces for electromigration in the copper damascene structure of FIG. 1 are the interface V1M1 at 22 and V1M2 at 24. Electromigration testing of the V1M1 interface 22 involves flowing electrons from the upper copper line in metal layer 16 (M2) through the conductive plug 15 and the via 14 and into the lower copper line in metal layer 10 (M1). Electromigration testing of the V1M2 interface 24 involves electrons flowing in the opposite direction. In the case of the V1M1 interface 22, electromigration voids typically generate at the copper/nitride or (copper/barrier) interface at the via 14. This is depicted in FIG. 2, where the electromigration void 26 is shown. The presence of a electromigration void 26 reduces the reliability of the device.

When aluminum is used as the interconnect material, it is well known that many alloying elements may be employed to improve the aluminum resistance to electromigration. One of the most widely used alloying elements is copper in aluminum. When copper is added in small concentrations to aluminum, the electromigration reliability increases by orders of magnitude. Similarly, alloying elements for copper have been under study. However, there are process differences between aluminum and copper that render the insertion of an alloy in the copper process flow a challenging proposition. For example, aluminum is a deposition, pattern and etch process, while copper is typically a damascene process with a physical vapor deposition (PVD) seed and electrochemical fill process.

Attempts have been made to introduce the alloy into the copper lines during electrochemical deposition, but many alloys of copper are not electrically active in aqueous solution. Another potential solution is to sputter the copper alloys during the PVD copper seed deposition, but there is a problem in that the alloying elements tend to sputter at a different rate than the copper matrix since different metals have different sputter yields. Another problem has been alloying element uniformity in the line after processing, which is determined by the seed thickness, aspect ratio, percent alloy in the copper target, annealing conditions, and plating process. An additional problem affecting alloy uniformity is linewidth variations.

SUMMARY OF THE INVENTION

There is a need to provide a metal interconnect structure and method of making the same that employs copper in the metallization layers and improves electromigration properties at critical electromigration failure sites.

These and other needs are met by embodiments of the present invention which provide a metal interconnect structure comprising a copper line and a dielectric layer over the copper line. The via extends through the dielectric layer to the copper line. The copper alloying element layer, comprising a copper alloying element, lines the via and covers the copper line exposed by the via. A conductive plug fills the via. A solid solution of copper and the alloying elements is provided in the copper line only in the area of the copper line adjacent to the conductive plug.

By providing a copper alloying element layer that lines the via that is directly over the copper line, a solid solution of copper and the alloying element may be formed in the area of the copper line directly underneath the conductive plug. Hence, the solid solution of copper and the alloying element is provided at the most critical electromigration failure site, i.e., the fast diffusion site below the via in the underlying copper line.

The earlier stated needs are also met by another aspect of the present invention which provides a method of selectively alloying an element to interconnect metallization. This method comprises the steps of etching an opening through a dielectric layer to expose a portion of an underlying metallization layer and form a via. An alloying element layer is deposited within the via to line the via and cover the exposed portion of the metallization layer. A solid solution of the alloying element and the metallization layer are formed at the exposed portion.

Still further aspects of the present invention provide a method of providing an alloying element for copper below a via at a top of a copper line covered by a dielectric layer. This method deposits a layer of an alloying element within a via to line the via and cover the top of the copper line that is exposed by the via. A conductive plug is formed in the via and annealing is performed. The annealing causes formation of a solid solution of the alloying elements at the top of the copper line that is covered by the layer of the alloying elements.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to electromigration failure in copper lines of metal interconnect structures. This present invention solves these problems, in part, by providing a copper alloying element inserted into the copper line at a critical electromigration failure site, which is the fast diffusion site below the via in the underlying metal. In embodiments of the present invention, after the via is patterned and etched, and prior to deposition of a refractory barrier metal, the alloying element is deposited within the via and on top of the exposed copper in the metal layer below. After deposition of the refractory barrier metal over the alloying element layer, a copper fill is performed. The structure is then annealed to stabilize the grain structure. This anneal serves to allow the alloying element to go into solid solution with the copper in and around the via. The structure is completed when excess copper, barrier metal and alloy metal are removed from the field by planarization.

Figure 1:
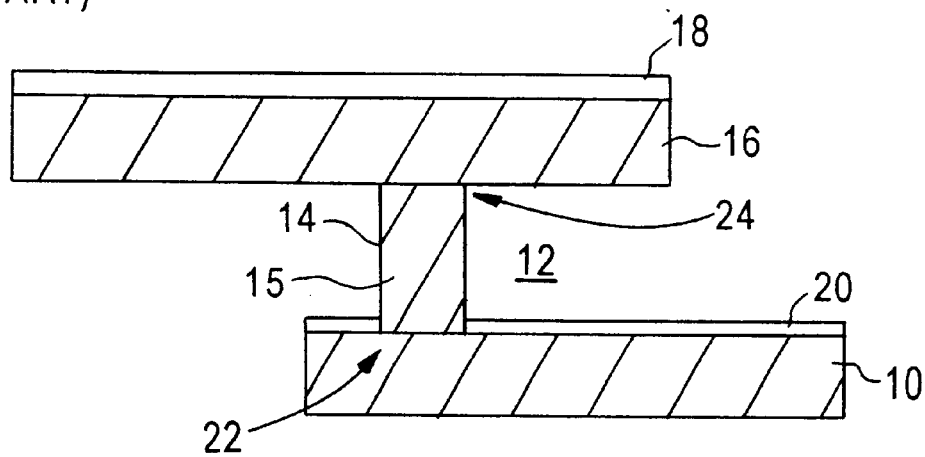
FIG. 1 is a cross-section of a metal interconnect structure constructed in accordance with prior methodologies.
Figure 2:
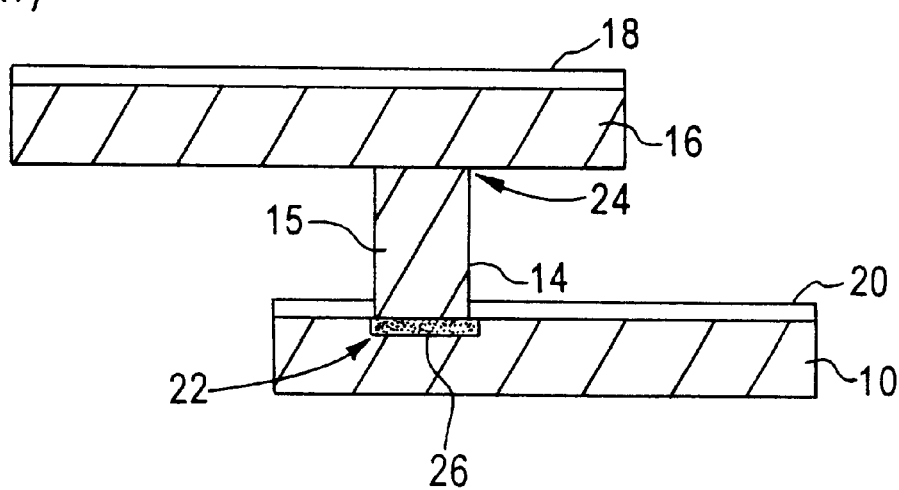
FIG. 2 depicts the structure of FIG. 1 with an electromigration void formed by the metal interconnect processing methodologies of the prior art.
Figure 3:
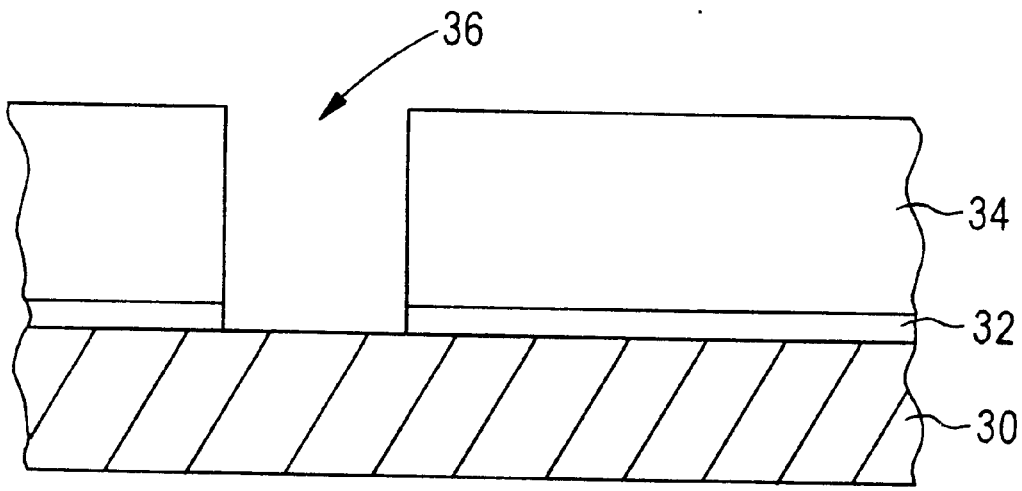
FIG. 3 is a cross-section of a portion of a metal interconnect structure after a via has been etched, in accordance with embodiments of the present invention.
Figure 4:
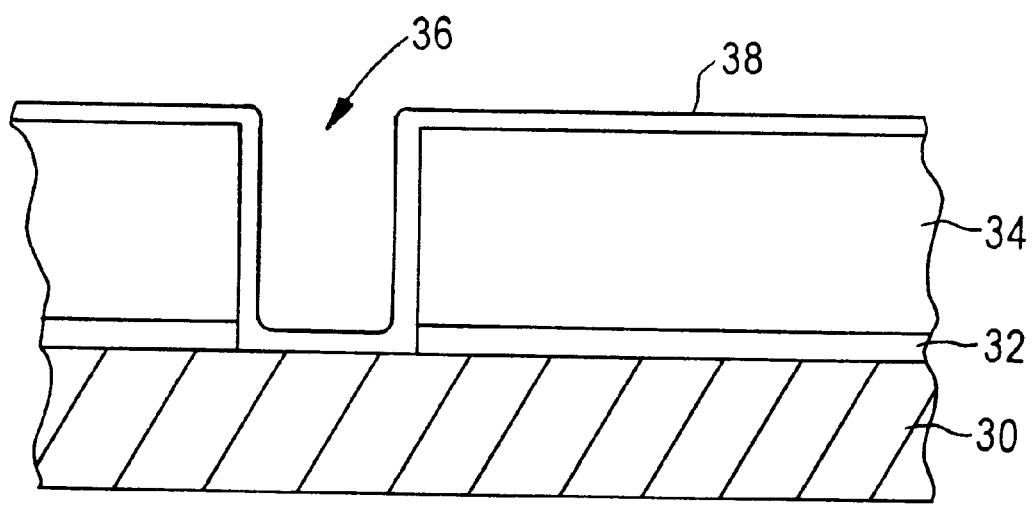
FIG. 4 shows the structure of FIG. 3 following the deposition of an alloying element layer within the via, in accordance with embodiments of the present invention.

FIG. 3 depicts a cross-section of the metal interconnect structure after a via has been formed. The first metal layer (M1) comprises a copper line 30 in FIG. 3. The copper line 30, which may be made of copper or a copper-based alloy, is covered by a diffusion barrier layer 32. An exemplary material for the diffusion barrier layer 32 is a nitride, although other materials may be employed without departing from the scope of the invention. A dielectric layer 34 is provided on the diffusion barrier layer 32. Dielectric layer 34 may be made of a conventional dielectric material, such as an oxide or a low k dielectric material, either organic or inorganic. The low k dielectrical materials are advantageous in reducing the resistance-capacitance (RC) of the structure.

A via 36 is etched through the dielectric layer 34 and diffusion barrier layer 32. The via 36 extends to the top of the copper line 30 of the metallization layer. The method for forming the structure of FIG. 3, including the etching steps, may be conventional in nature.

In order to increase the resistance to electromigration in the copper line 30, a copper alloying element layer 38, also described as the alloying element layer 38, is deposited within the via 36. Hence, the alloying element layer 38 covers the sidewalls of the via, the top of the copper line 30, and the field. Exemplary alloying elements include Sn, Pd, C, Ca, Mg, Al and Hf. In especially preferred embodiments, either Sn or Al are used as the alloying element. These elements, when alloyed with copper, increase the electromigration resistance to the copper.

The alloying element layer 38 may be deposited by conventional methods, including more advanced methods such as advanced ionized physical vapor deposition, hollow cathode magnetron sputtering, or self-ionizing plasma deposition. It is preferred to deposit the alloying element layer 38 in a manner that prevents copper overhang, so good step coverage of the alloying element is desirable. For these reasons, some of the advanced deposition methods mentioned above are considered advantageous.

The deposition of the alloying element layer 38 is preferably performed in-situ (without breaking vacuum) on the same deposition equipment that will be used for the deposition of the barrier metal layer and the copper seed. An additional chamber is provided on the deposition tool for the alloying elements deposition from a pure target. For instance, if the alloying element is Sn, then the target would be Sn. The alloying element layer 38 may be deposited in a thickness of between about 50 and about 200 Å, for example.

The provision of the alloying element layer 38 within the via 36 on top of the copper line 30 provides the alloying element, such as Sn or Al, directly at one of the most critical electromigration failure sites, i.e., at the fast diffusion site below the via in the underlying copper.

Figure 5:
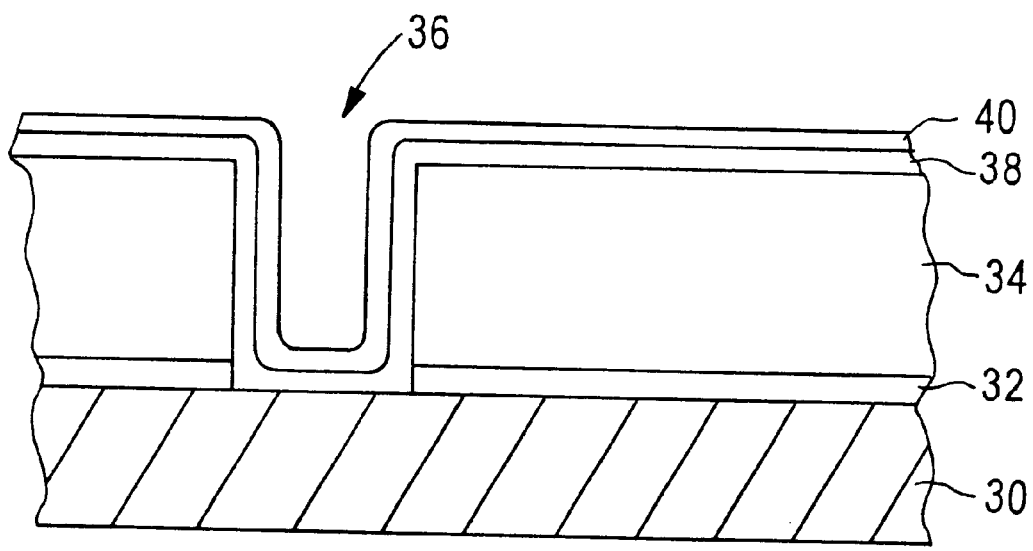
FIG. 5 depicts the structure of FIG. 4 following deposition of a barrier metal layer over the alloying element layer, in accordance with embodiments of the present invention.

In FIG. 5, a barrier metal layer 40 has been deposited over the alloying element layer 38. The barrier metal layer 40, comprising a refractory barrier metal such as tantalum (Ta) or tantalum nitride (TaN) prevents diffusion of the copper into the dielectric layer 34. It also serves to provide adhesion for the subsequent copper seed layer. The barrier metal layer 40 is deposited in a conventional manner.

Figure 6:
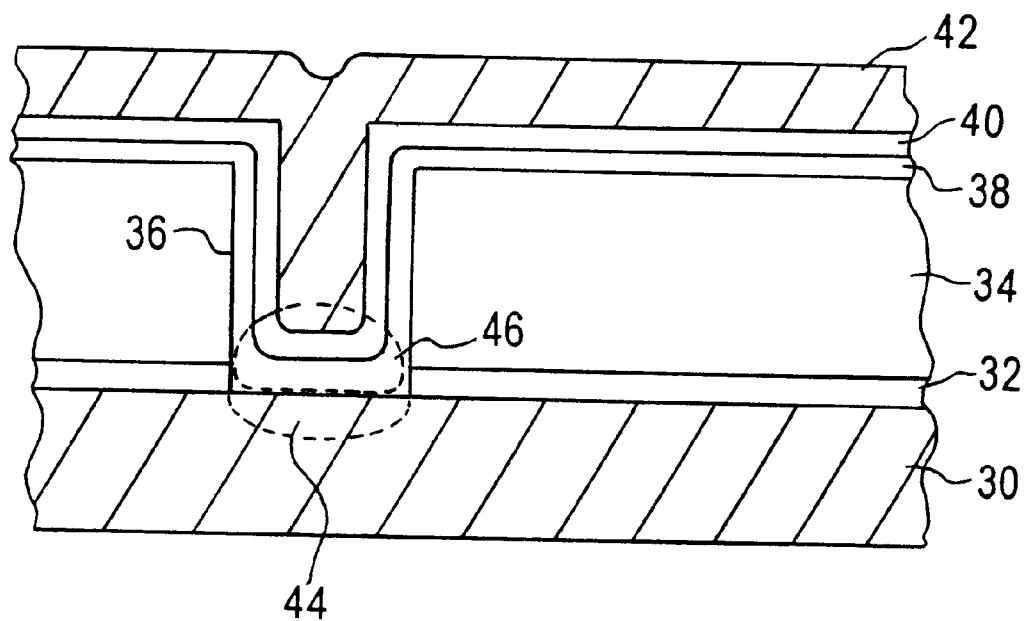
FIG. 6 shows the structure of FIG. 5 following a copper field process and annealing to form solid solution regions, in accordance with embodiments of the present invention.

FIG. 6 shows the structure of FIG. 5 following the filling of copper within the via 36. The copper fill 42 follows the formation of the copper seed layer (not shown) on the barrier metal layer 40. The via 36 may be filled with copper by conventional deposition techniques, such as electrochemical deposition, physical vapor deposition, or chemical vapor deposition, for example. The copper fill 42 completely fills the via 36 within the confines of the barrier metal layer 40 and over the field.

Following the filling of the copper, or copper-based alloy, an annealing is performed, which has certain effects. One of these effects is to stabilize the grain structure. However, another effect is to form solid solution regions 44 and 46 of the alloying elements and the copper in and around the via 36. The solid solution region 44 within the copper line 30 is depicted by dashed lines and the solid solution region 46 within the via 36 is also depicted by dashed lines. The configuration of the solid solution regions 44, 46 is exemplary only, in the schematic diagram of FIG. 6.

An exemplary annealing process exposes the structure to temperatures between about 150° C. to about 400° C. for between about 10 to about 90 minutes, in certain embodiments of the invention. In especially preferred embodiments, the temperature is between about 200 to about 300° C.

Figure 7:
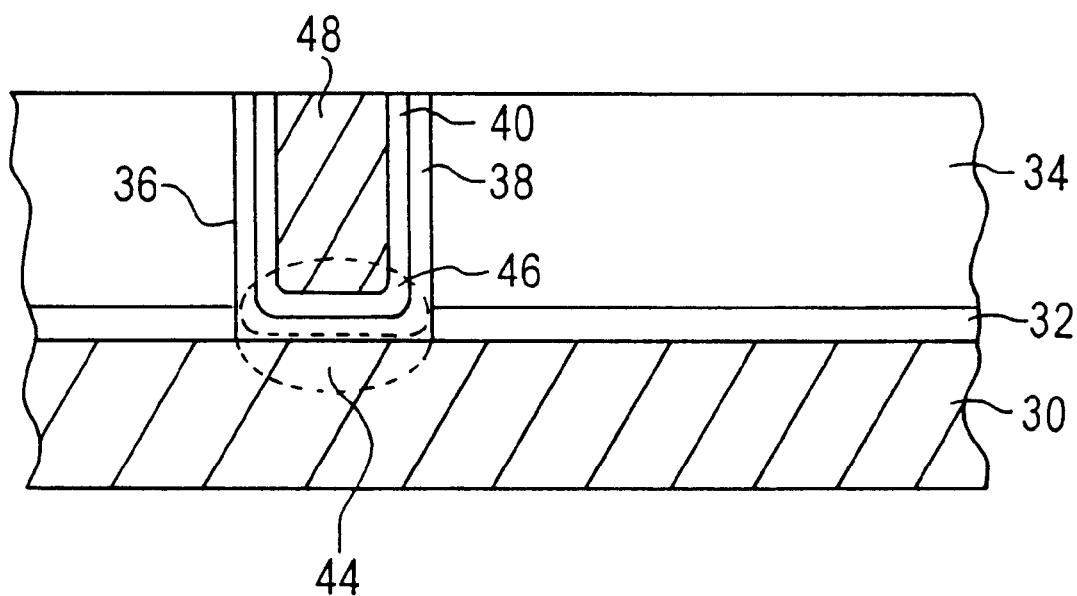
FIG. 7 shows the structure of FIG. 6 after planarization is performed, in accordance with embodiments of the present invention.

In FIG. 7, the structure has been planarized to remove excess copper fill, barrier metal layer 40 and alloying elements layer 38 formed on the field. A conductive plug 48 is therefore formed within the via 36. The conductive plug 48 may be considered to comprise the copper or copper-based alloy 48, the barrier metal layer 40 and the alloying element layer 38, as well as any solid solution region 46 formed within the via 36.

As a solid solution of the copper alloying element is formed in the region 44, which is critical electromigration failure site, i.e., the fast diffusion site below the via 36 in copper line 30, the electromigration reliability of the structure is improved in a targeted and efficient manner. This is accomplished without attempting to alloy the entire copper line 30 with an alloying elements suitable for improving electromigration in copper.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of selectively alloying an element to interconnect metallization, comprising the steps of:

etching an opening through a dielectric layer to expose a portion of an underlying copper metallization layer and form a via;

depositing an alloying element layer consisting essentially of an alloying element within the via and directly on the exposed copper metallization layer to line the via and cover the exposed portion of the copper metallization layer; and forming a solid solution of the alloying element and the copper metallization layer at the exposed portion.

2. The method of claim 1, wherein the alloying element is at least one of Sn, Pd, C, Ca, Mg, Al and Hf.

3. The method of claim 2, further comprising depositing a barrier layer in the opening and filling the opening with copper or a copper-based alloy.

4. The method of claim 3, wherein the step of depositing an alloying element layer includes depositing the alloying element layer with a thickness between about 50 Å to about 200 Å.

5. The method of claim 4, wherein the step of depositing an alloying element layer includes one of advanced ionized physical vapor deposition, hollow cathode magnetron sputtering, and self-ionizing plasma deposition.

6. The method of claim 5, wherein the step of forming the solid solution comprises annealing at a temperature of between about 150° C. to about 400° C. for between about 10 minutes to about 90 minutes.

7. A method of providing an alloying element for copper below a via at a top of a copper line covered by a dielectric layer, comprising the steps of:

depositing an alloying element layer consisting essentially of an alloying element within a via to line the via and directly on the top of the copper line that is exposed by the via to line the via and cover the top of the copper line that is exposed by the via;

forming a conductive plug in the via; and annealing to cause formation of a solid solution of the alloying element at the top of the copper line that is covered by the layer of the alloying element.

8. The method of claim 7, wherein the alloying element is at least one of Sn, Pd, C, Ca, Mg, Al, and Hf.

9. A method of providing an alloying element for copper below a via at a top of a copper line covered by a dielectric layer, comprising the stops of:

depositing a layer of an alloying element within a via to line the via and cover the top of the copper line that is exposed by the via;

forming a conductive plug in the via; and annealing to cause formation of a solid solution of the alloying element at the top of the copper line that is covered by the layer of the alloying element;

wherein the alloying element is at least one of Sn, Pd, C, Ca, Mg, Al, Hf; and wherein the step of forming a conductive plug comprises depositing a barrier layer over the layer of an alloying element, and depositing copper over the barrier layer.

10. The method of claim 9, wherein the step of depositing a layer of an alloying elements includes one of advanced ionized physical layer deposition, hollow cathode magnetron sputtering, and self-ionizing plasma deposition.

11. The method of claim 10, wherein the step of annealing includes annealing at a temperature of between about 150° C. to about 400° C. for between about 10 minutes to about 90 minutes.

* * * * *